(12) United States Patent
Gunn et al.

(10) Patent No.: US 10,495,727 B2
(45) Date of Patent: Dec. 3, 2019

(54) PHASE DIFFERENCE ESTIMATOR AND METHOD FOR ESTIMATING A PHASE DIFFERENCE BETWEEN SIGNALS

(71) Applicant: Raytheon Company, Waltham, MA (US)

(72) Inventors: Brian A. Gunn, Goleta, CA (US); Bruce A. Jensen, Goleta, CA (US)

(73) Assignee: Raytheon Company, Waltham, MA (US)

( * ) Notice: Subject to any disclaimer, the term of this patent is extended or adjusted under 35 U.S.C. 154(b) by 277 days.

(21) Appl. No.: 15/426,193

(22) Filed: Feb. 7, 2017

(65) Prior Publication Data

US 2018/0224524 A1 Aug. 9, 2018

(51) Int. Cl.
*G01S 7/02* (2006.01)
*G01S 7/28* (2006.01)
(Continued)

(52) U.S. Cl.
CPC ............ *G01S 7/021* (2013.01); *G01S 5/0221* (2013.01); *G01S 5/06* (2013.01); *G01S 7/2813* (2013.01); *G01S 11/02* (2013.01); *H03D 13/00* (2013.01)

(58) Field of Classification Search
CPC .......... G01S 11/02; G01S 5/0221; G01S 5/06; G01S 7/021; G01S 7/2813; H03D 13/00
(Continued)

(56) References Cited

U.S. PATENT DOCUMENTS 2,705,320 A   3/1955 Winslow
3,025,520 A   3/1962 Werner et al.
(Continued)

FOREIGN PATENT DOCUMENTS

EP   0616443 A2   9/1994
EP   1891700 B1   2/2013
(Continued)

OTHER PUBLICATIONS

"U.S. Appl. No. 13/788,098, Non Final Office Action dated Dec. 26, 2014", 8 pgs.
(Continued)

*Primary Examiner* — Timothy A Brainard
(74) *Attorney, Agent, or Firm* — Schwegman Lundberg & Woessner, P.A.

(57) ABSTRACT

Embodiments of a phase difference estimator and method are generally described herein. The phase difference estimator includes a delay element to delay a reference clock signal that includes an alternating symbol waveform by one of a plurality of delay values. The phase difference estimator further includes a sampler to sample a monitored clock signal provided by a second device responsive to edges of the delayed reference clock signal to generate a sampled signal output. The phase difference estimator further includes a correlation element to correlate the sampled signal output of the sampler with a step function to generate a correlation value for each delay value, and a controller to instruct the delay element to delay the reference clock signal by one of the delay values and provide a phase difference estimate output indicative of a phase difference between the reference and monitored clock signals based on the correlation value.

25 Claims, 5 Drawing Sheets

(51) Int. Cl.
  *G01S 5/02* (2010.01)
  *G01S 5/06* (2006.01)
  *G01S 11/02* (2010.01)
  *H03D 13/00* (2006.01)

(58) Field of Classification Search
  USPC .................................................... 342/20
  See application file for complete search history.

(56) References Cited

U.S. PATENT DOCUMENTS

| | | | |
|---|---|---|---|
| 3,097,355 A | 7/1963 | Hobrough et al. |
| 3,223,998 A | 12/1965 | Hose |
| 3,264,644 A | 8/1966 | Jacob |
| 3,377,590 A | 4/1968 | Wendell |
| 3,530,467 A | 9/1970 | Attwood et al. |
| 4,041,381 A | 8/1977 | Hwa |
| 4,562,573 A | 12/1985 | Murano et al. |
| 4,620,788 A | 11/1986 | Giger |
| 5,528,183 A | 6/1996 | Maturi et al. |
| 5,878,032 A | 3/1999 | Mirek |
| 6,211,812 B1 | 4/2001 | Chiles et al. |
| 6,359,479 B1 | 3/2002 | Oprescu |
| 6,477,674 B1 | 11/2002 | Bates et al. |
| 6,545,979 B1 | 4/2003 | Poulin |
| 6,614,387 B1 | 9/2003 | Deadman |
| 6,671,261 B1 | 12/2003 | Cheung |
| 6,731,908 B2 | 5/2004 | Berliner et al. |
| 6,920,155 B2 | 7/2005 | Rao |
| 6,943,595 B2 | 9/2005 | Sugimoto et al. |
| 7,139,957 B2 | 11/2006 | Querbach et al. |
| 7,199,751 B2 | 4/2007 | Mikami et al. |
| 7,248,205 B2 | 7/2007 | Uchino |
| 7,259,713 B1 | 8/2007 | Matich et al. |
| 7,330,148 B2 | 2/2008 | Takenouchi et al. |
| 7,359,408 B2 | 4/2008 | Kim |
| 7,525,483 B2 | 4/2009 | Eberlein |
| 7,533,285 B2 | 5/2009 | Naffziger et al. |
| 7,714,777 B2 | 5/2010 | Fukuda |
| 7,765,074 B2 | 7/2010 | Kim et al. |
| 9,071,234 B2 | 6/2015 | Gunn et al. |
| 2005/0276318 A1 | 12/2005 | Bokhour |
| 2007/0109175 A1 | 5/2007 | Fukuda |
| 2009/0267666 A1 | 10/2009 | Marutani |
| 2011/0043693 A1 | 2/2011 | Nakahira et al. |
| 2011/0115669 A1 | 5/2011 | Milyutin et al. |
| 2011/0122020 A1 | 5/2011 | Henkel |
| 2012/0176271 A1 | 7/2012 | Dai et al. |
| 2014/0253200 A1 | 9/2014 | Gunn |
| 2014/0253387 A1* | 9/2014 | Gunn .................... H04B 3/462 342/417 |
| 2016/0043823 A1* | 2/2016 | Zhao .................... H04J 3/0697 370/350 |

FOREIGN PATENT DOCUMENTS

| | | |
|---|---|---|
| EP | 2965470 | 1/2016 |
| WO | WO-2006108227 A1 | 10/2006 |
| WO | WO-2014138345 A1 | 9/2014 |
| WO | 2018147927 | 8/2018 |

OTHER PUBLICATIONS

"U.S. Appl. No. 13/788,098, Notice of Allowance dated Feb. 27, 2015", 8 pgs.

"U.S. Appl. No. 13/788,098, Response filed Feb. 6, 2015 to Non Final Office Action dated Dec. 26, 2014", 13 pgs.

"International Application Serial No. PCT/US2014/021046, International Search Report dated Jun. 24, 2014", 3 pgs.

"International Application Serial No. PCT/US2014/021046, Written Opinion dated Jun. 24, 2014", 9 pgs.

"International Application Serial No. PCT US2017 065153, International Search Report dated Apr. 5, 2018", 5 pgs.

"International Application Serial No. PCT US2017 065153, Written Opinion dated Apr. 5, 2018", 8 pgs.

"Gulf Cooperation Council Application Serial No. 2017/34383, Office Action dated Apr. 25, 2019", 4 pgs.

* cited by examiner

PHASE DIFFERENCE ESTIMATOR AND METHOD FOR ESTIMATING A PHASE DIFFERENCE BETWEEN SIGNALS

GOVERNMENT RIGHTS

This invention was made with Government support under Contract Number FA8625-11-C-6600 awarded by the Department of Defense. The Government has certain rights in this invention.

TECHNICAL FIELD

Embodiments relate to signal phase difference estimation between electronic components. Some embodiments relate to signal phase estimation in systems of spatially-distributed sensors. Some embodiments relate to signal-source location including geo-location. Some embodiments relate to determining clock-phase separation of spatially-distributed subsystems. Some embodiments relate to radar-warning receiver (RWR) systems.

BACKGROUND

Electronic communication between distinct components within a system may experience phase differences between signals among different components. Systems may need to compensate for these phase differences appropriately for the successful implementation of certain functions and/or algorithms. For example, a device receiving reports from one or multiple remote sensors over fiber-optic links may compensate for the signal phase differences to correctly record the times at which observations are made.

Many conventional techniques for signal phase difference estimation do not provide sufficient resolution for some applications, such as systems of independently-controlled, spatially-distributed sensors, signal-source location systems, and RWR systems. Thus, there are general needs for systems and methods for high-resolution signal phase difference estimation. There are also general needs for high-resolution signal phase difference estimation suitable for use in systems of spatially-distributed sensors. There are also general needs for high-resolution signal phase difference estimation suitable for signal-source location and RWR systems.

DETAILED DESCRIPTION

The following description and the drawings sufficiently illustrate specific embodiments to enable those skilled in the art to practice them. Other embodiments may incorporate structural logical electrical, process, and other changes. Portions and features of some embodiments may be included in, or substituted for, those of other embodiments. Embodiments set forth in the claims encompass all available equivalents of those claims.

Figure 1:
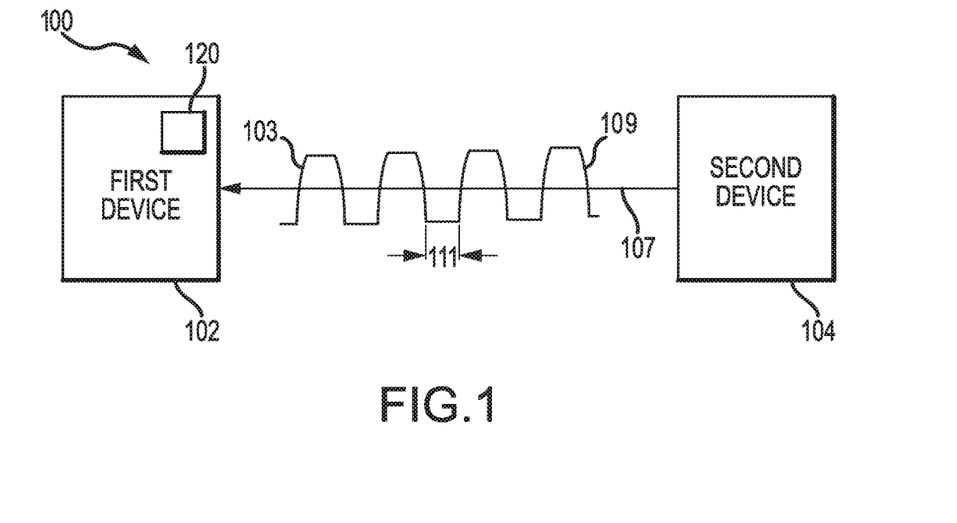
FIG. 1 is a functional block diagram illustrating a system to estimate a phase difference between a reference clock signal of a master device and a monitored clock signal of a remote device in accordance with some embodiments.

FIG. 1 is a functional block diagram of a system 100 to estimate a phase difference between a reference clock signal of a first device 102 (e.g., a mater device) and a monitored clock signal of a second device 104 (e.g., a remote device) in accordance with some embodiments. The first device 102 and the second device 104 may be configured to communicate electronic signals over signal path 107.

In accordance with embodiments, the first device 102 may include a phase difference estimator 120 that may be configured to estimate a phase difference between a monitored clock signal 103 received from the second device 104 via the signal path 107. In accordance with some embodiments, the phase difference estimator 120 may iteratively adjust a phase of a reference clock signal (e.g., internal to the first device 102), sample the monitored clock signal 103 relative to the reference clock signal and perform an analysis of the current and previous samples to determine correlation with an expected waveform (e.g., a square wave).

During the phase adjustment and sample steps, the phase difference estimator 120 may shift the reference clock signal by one of a plurality of delay or phase-shift values and may sample the monitored clock signal 103 relative to the reference clock signal to generate a sampled signal output. The phase difference estimator 120 may also correlate a noise-reduced version of the sampled signal output with a step function to generate a correlation value for each of the phase-shift values. The phase difference estimator 120 may also step through at least some of the delay or phase-shift values to select one of the delay or phase-shift values to generate a phase difference estimate. The phase difference estimate may be an estimate of the phase difference to within a fraction of the symbol period 111.

In some embodiments, the transmit waveform 103 may be a waveform of alternating symbols or bits such as a square wave as illustrated in FIG. 1 although the scope of the embodiments is not limited in this respect as other waveforms of alternating symbols or bits may also be used. In some embodiments, the first device 102 may include signal generating circuitry to generate the reference clock signal and the second device 104 may include signal generating circuitry to generate the monitored clock signal 103 and signal transmitting circuitry to transmit the monitored clock signal 103 to the first device 102.

In some embodiments, the phase difference estimator 120 may sample the monitored clock signal 103 on rising edges 109 of the reference clock signal to generate the sampled signal output. In other embodiments, the phase difference estimator 120 may sample the monitored clock signal 103 on falling edges 109 of the reference clock signal to generate the sampled signal output.

In some embodiments, the first device 102 and second device 104 may be configurable to operate in one of either an asynchronous mode or a data-transfer mode. During asynchronous mode, the second device 104 may be configured to refrain from clocking or re-clocking signals and may provide the monitored clock signal 103 to the first device 102 via the path 107. During data transfer mode, the second device 104 may be configured to communicate data with the first device 102. In these embodiments, asynchronous mode may be entered into as part of a calibration procedure. During data transfer mode, a serial data link may be established between the first device 102 and the second device 104 during which data clocking or re-clocking may be performed.

During the measurement of the phase difference between the reference clock signal and the monitored clock signal 103, the first device 102 may account for the propagation delay along the signal path 107. In some embodiments, the signal path 107 is a fixed signal path and may comprise, for example, conventional signal wiring, such as copper wire and/or fiber. In these embodiments, the first device 102 and the second device 104 may be at fixed locations relative to each other with a known signal propagation delay estimated to within a fraction of the symbol period 111 of the monitored clock signal 103. Although the signal path 107 may be fixed, environmental conditions such as temperature may also affect the propagation delay. In some alternate embodiments, the signal path 107 may comprise wireless links, such as optical radio-frequency (RF) or microwave links, although the scope of the embodiments is not limited in this respect.

In some embodiments, the first device 102 may be configured to communicate with a plurality of second devices 104. In these embodiments, the phase difference estimator 120 may estimate a phase difference between the reference clock signal of the first device 102 and the monitored clock signals of one or more of the second devices 104. In some of these embodiments, the phase difference estimator 120 may estimate a relative phase difference between the reference clock signal and the monitored clock signal of the second devices 104, rather than an absolute phase difference. In some examples, rather than adjusting a phase of the reference clock signal, the phase difference estimator may adjust the phase of the monitored clock signal 103 to determine a phase difference between the reference clock signal and the monitored clock signal 103. These embodiments are discussed in more detail below.

Figure 2:
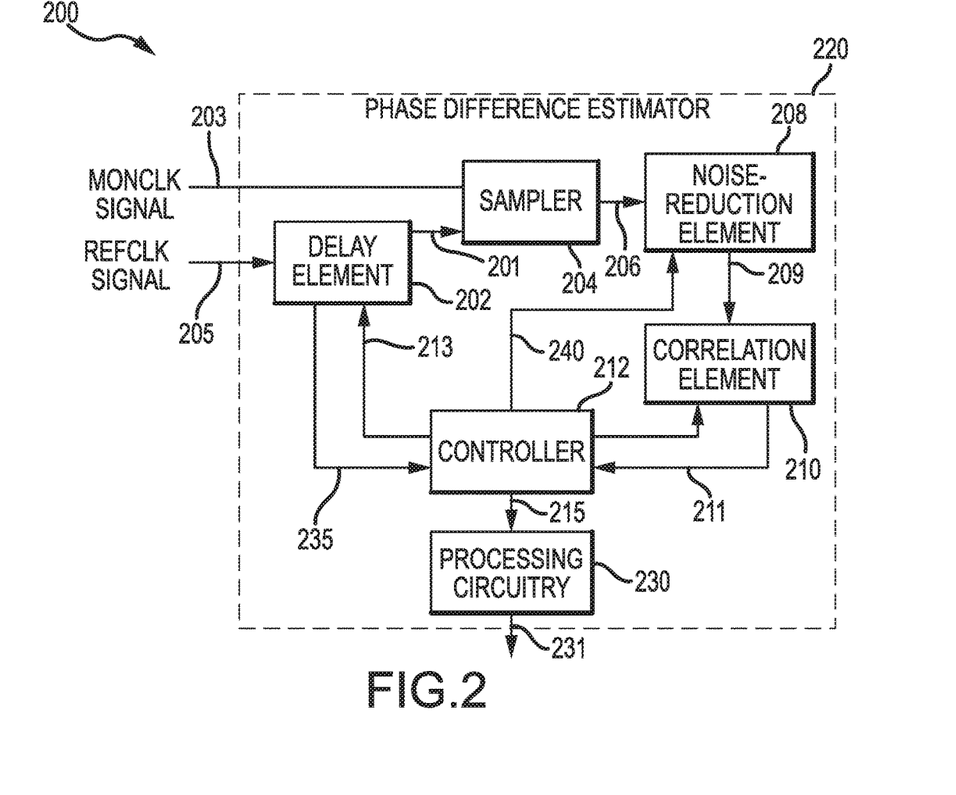
FIG. 2 is a functional block diagram of system that includes a phase difference estimator in accordance with some embodiments.

FIG. 2 is a functional block diagram of a system 200 that includes a phase difference estimator 220 in accordance with some embodiments. The phase difference estimator 220 may be suitable for use as the phase difference estimator 120 of FIG. 1, although other configurations may also be suitable.

In some embodiments, the phase difference estimator 220 may include a delay element 202 to selectably delay the reference clock signal 205 by one of a plurality of delay values (e.g., to adjust a relative phase). The reference clock signal 205 may comprise a waveform of alternating symbols.

The phase difference estimator 220 may also include a sampler 204 to sample the monitored clock signal 203 to generate a sampled signal output 206. In some embodiments, the sampler 204 may sample the monitored clock signal 203 on rising edges of the reference clock signal 205 to generate the sampled signal output 206.

The phase difference estimator 220 may also include a correlation element 210 to correlate an output of the sampler 204 with a step function to generate a correlation value 211 for each of the delay values. In some embodiments that implement noise reduction and as shown in FIG. 2, the correlation element 210 may correlate a noise-reduced output 209 of the sampler 204 with a step function to generate the correlation value 211 for each of the delay values. As described below, the noise-reduced output 209 is generated by a noise-reduction element 208, which provides the noise-reduced output 209 of the sampler 204 to the correlation element 210.

The phase difference estimator 220 may also include a controller 212 to instruct the delay element 202 to delay the reference clock signal 205 by a selected one of the delay values. The controller 212 also generates a phase difference estimate output 215 based on the correlation value 211 for the selected delay value. In some examples, the delay element 202 may feedback a selected phase shift or delay value 235 to the controller 212. The phase difference estimate output 215 may be an indicator of the signal-path delay to within a fraction of a symbol period (e.g., the symbol period 111 of FIG. 1) of the reference clock signal 205.

In some embodiments, the fraction of the symbol period of the reference clock signal 205 to which the phase difference estimator 220 may estimate the phase difference between the reference clock signal 205 and the monitored clock signal 203 may be a portion of the symbol period and not necessarily a fractional portion of the symbol period, although this is not a requirement. However, the phase difference estimator 220 may estimate the phase difference to a fractional portion of the symbol period.

In some embodiments, the reference clock signal 205 may comprise a waveform of alternating bits. The phase difference estimate output 215 may be an indicator of the phase difference to within a portion or fractional portion of the symbol or bit period of the reference clock signal 205.

In some embodiments, the delay element 202 may be a phase-shifter to phase shift either the reference clock signal 205 or the monitored clock signal 203 by one of a plurality of phase-shift values. In these embodiments, the sampler 204 may sample the monitored clock signal 203 on rising edges of the reference clock signal 205 to generate the sampled signal output 206. In these embodiments, the controller 212 may instruct the phase-shifter to phase-shift the reference clock signal 205 by one of the phase-shift values and generate a phase difference estimate output 215 based on the correlation value 211 for one of the phase-shift values.

Figure 3:
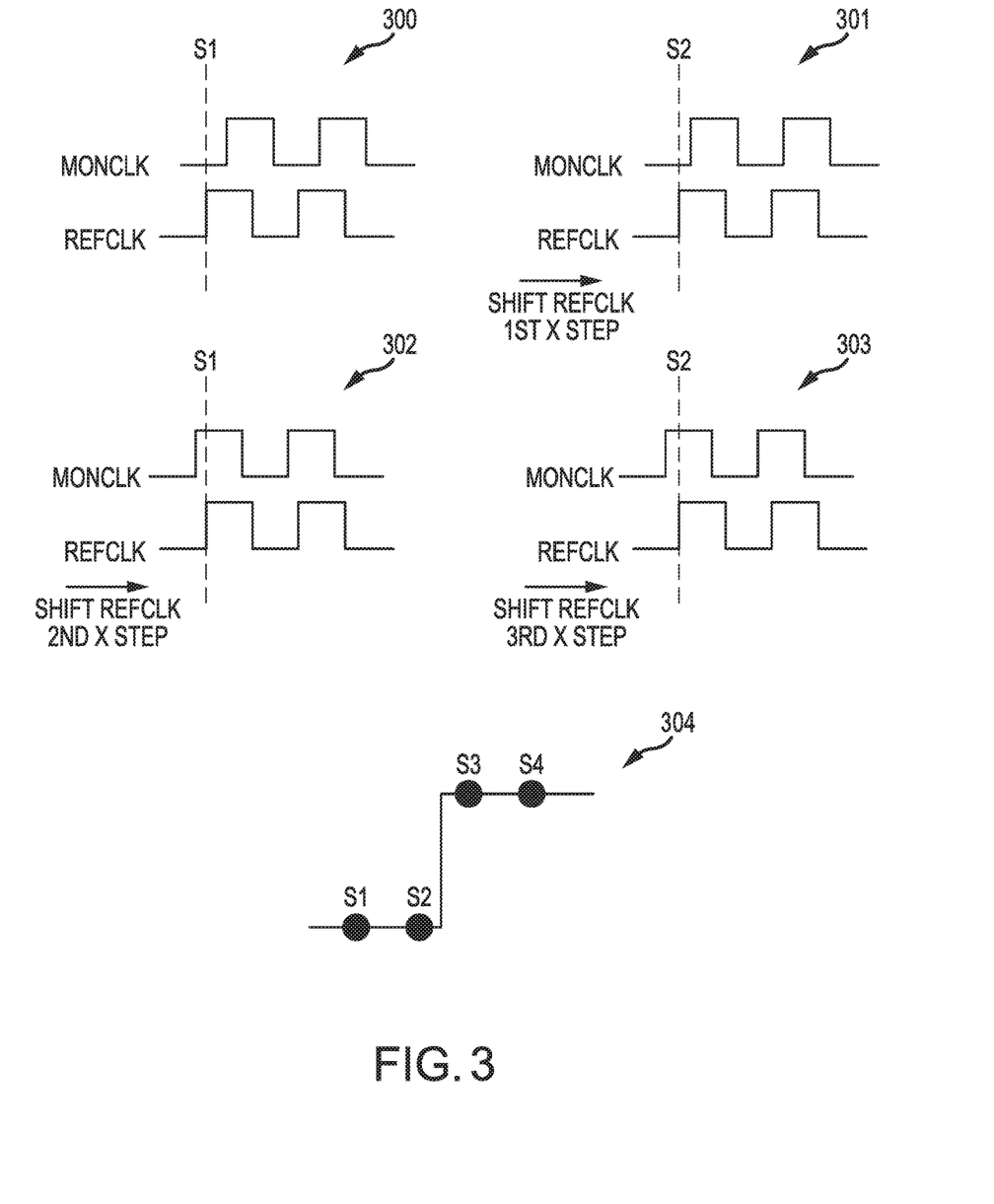
FIG. 3 illustrates noise reduction operations in accordance with some embodiments.

In accordance with embodiments, the step function used by the correlation element 210 models a noiseless transition (e.g., from low to high or from high to low) of the sampled signal output 206 relative to a phase-shift value allowing the correlation element 210 to generate a correlation value 211 for the particular phase-shift value that is currently implemented by the delay element 202. FIG. 3 illustrates exemplary signal timing diagrams for determining a correlation between signal phases and a step function by the correlation element in accordance with some embodiments. In diagram 300, the reference clock is set to an initial phase and a first sample S1 is taken. In diagram 301, the reference clock is phase-shifted to a second phase and a second sample S2 is taken. In diagram 302, the reference clock is phase-shifted to a third phase and a third sample S3 is taken. In diagram 303, the reference clock is phase-shifted to a fourth phase and a fourth sample S4 is taken. The samples S1-S4 are correlated to a step function 304 to determine a phase difference as depicted in FIG. 3. In this specific example, the phase difference between the reference clock signal and the monitored clock signal is somewhere between the second phase and the third phase.

Referring again to FIG. 2, and in some embodiments, the delay element 202, the controller 212, and the processing circuitry 230, or combinations thereof, may compensate for a propagation delay (e.g., along the path 107 of FIG. 1) of the monitored clock signal 203 received at the phase difference estimator 220. For example, to compensate for the propagation delay, the delay element 202 may add a delay to the reference clock signal 205 that matches the propagation delay, in addition to the delay or phase shift to be used to determine the phase difference. In another example, the controller 212 may direct the delay element 202 to add the propagation delay, and in the phase difference estimate output 215 may subtract the propagation delay timing. In some examples, the processing circuitry 230 may adjust the phase difference estimate 231 based on the propagation delay. In some embodiments, the processing circuitry 230 may further be configured to compensate for any logic and propagation delay experienced within the elements of the phase difference estimator 220 (and within the path to the phase difference estimator 220 to generate the phase difference estimation 231.

In some embodiments, the controller 212 may provide a control signal 213 to the delay element 202 to cause the delay element 202 to shift the reference clock signal 205 by a selected one of the delay values. In some examples, the delay element 202 may include a phase-shifter (not shown), and the controller 212 may be configurable to cause the phase-shifter to shift through at least some of the phase-shift values and select one of the phase-shift values that provides either a highest (e.g., maximum) correlation value 211 or a correlation value above a threshold to generate the phase difference estimate output 215 corresponding to the selected phase-shift value.

In some embodiments, the estimate of the phase difference between the reference clock signal 205 and the monitored clock signal 203 may be to the nearest bit or symbol period. In some embodiments, the symbol period may be a half-clock period (e.g., the symbol period 111 of FIG. 1).

The delay or phase shift value that results in a highest correlation value 211 may be the delay or phase shift at which the reference clock signal 205 and the monitored clock signal 203 align to within a fraction of the symbol period. This fraction may be based on the resolution of the delay element 202 and may be based on the number of delay or phase shift values per symbol period. For example, when 256 phase shift values per symbol period are used, the phase difference may be estimated to within $1/256^{th}$ of the symbol period. The attainable resolution may be limited by the resolution of the delay or phase shift element 202. In some embodiments, the processing circuitry 230 may adjust the phase difference estimate output 215 based on a propagation delay between the device providing the monitored clock signal and the phase difference estimator 220.

In some embodiments, the controller 212 may be configurable to cause the phase shifter to either step or shift through all possible of the phase-shift values (e.g., 256 phase-shift values) based on the resolution of the phase shifter and may select one of the phase-shift values which results in a highest correlation value 211. In other embodiments, the controller 212 may be configurable to cause the phase shifter to step or shift through at least some of the phase-shift values to select one of the phase-shift values resulting in a correlation value 211 above a predetermined threshold. In some embodiments, each of the phase-shift values may be a fraction of the symbol period of the reference clock signal 205 and the plurality of phase-shift values together may add up to one symbol period of the reference clock signal 205.

In some embodiments, the sampler 204 may provide a low output (e.g., zero) when the monitored clock signal 203 is low (e.g., zero) while the delayed transmit signal 201 (e.g., the sampled signal) is rising, and may provide a high output (e.g., one) when the monitored clock signal 203 is high (e.g., one) while the delayed transmit signal 201 (e.g., the sampled signal) is rising. In some alternate embodiments, instead of sampling the sampled signal while rising (e.g., on the rising edge), the sampled signal may be sampled while falling (e.g., on the falling edge).

The controller 212 may cause the delay element 202 to either increment or decrement the delay value (or the phase shift value) depending on the output of the sampler 204. For example, the controller 212 may cause the delay element 202 to increment the delay value or phase shift value when the output of the sampler 204 is low, and the controller 212 may cause the delay element to decrement the delay value of the phase shift value when the output of the sampler 204 is high.

In some embodiments, signals derived from the reference clock signal 205 and the monitored clock signal 203 may be used by the sampler 204 instead of the actual reference clock signal 205 and monitored clock signal 203. These derived signals may be generated, for example, by a phase-locked loop (PLL) or an inverter.

In some embodiments, the phase difference estimator 220 may include processing circuitry 230. The processing circuitry 230 may be arranged to adjust the phase difference estimate 231 to within a fraction of the symbol period. Since the time output 215 generated by the controller 212 may represent an amount of phase shift or delay introduced to align the delayed reference clock signal 205.

In some alternate embodiments, the delay element 202 may be configured to delay the monitored clock signal 203 instead of the reference clock signal 205 by one of the plurality of delay values. In these embodiments, the controller 212 may instruct the delay element 202 to delay the monitored clock signal 203 by one of the delay values, and the sampler 204 may be arranged to provide either a low or high output based on the state of the reference clock signal 205 while the monitored clock signal 203 is changing states (either rising or falling). The phase difference estimate output 215 may be adjusted to account for the propagation delay between the device that provides the monitored clock signal 203.

In some embodiments that implement noise reduction, the phase difference estimator 220 may include the noise-reduction element 208. The noise-reduction element 208 may be arranged to use multiple sampled signal outputs 206 taken at a common one of the delay or phase shift values from the sampler 204 to produce the noise-reduced output 209 for use by the correlation element 210. In these embodiments, the use of the noise-reduction element 208 may cause a higher correlation in the correlation element 210 at the transition (e.g., from low to high or from high to low). In some embodiments, the noise-reduction element 208 may be arranged to take a sum, average, mode, etc., of the multiple sampled signal outputs 206 taken at the same delay or phase shift value to produce the noise-reduced output 209 for use by the correlation element 210. The noise-reduction element 208 may be reset by the controller 212 via a reset signal 240.

In some examples, the phase difference estimator 220 may estimate a phase difference between the reference clock signal 205 and the monitored clock signal 203 when the cycle frequencies between the two signals differ by an integer multiple. For example, the reference clock signal 205 may have a frequency that is X times the frequency of the monitored clock signal 203, where X is an integer. Conversely, the monitored clock signal 203 may have a frequency that is X times the frequency of the reference clock signal 205, where X is an integer. In either case, the phase difference estimator 220 may be capable of determining a phase difference between the two signals. In the case where the reference clock signal 205 has a frequency that is X multiple of the monitored clock signal 203 and the noise reduction is applied, the noise reduction element 208 may consider every X sample of the multiple sampled signal outputs 206, and may discard or disregard the X−1 intermediary samples.

Although the phase difference estimator 220 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors. DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements of the phase difference estimator 220 may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, system 200 may include one or more processors and may be configured with instructions stored on a computer-readable storage device.

Figure 4:
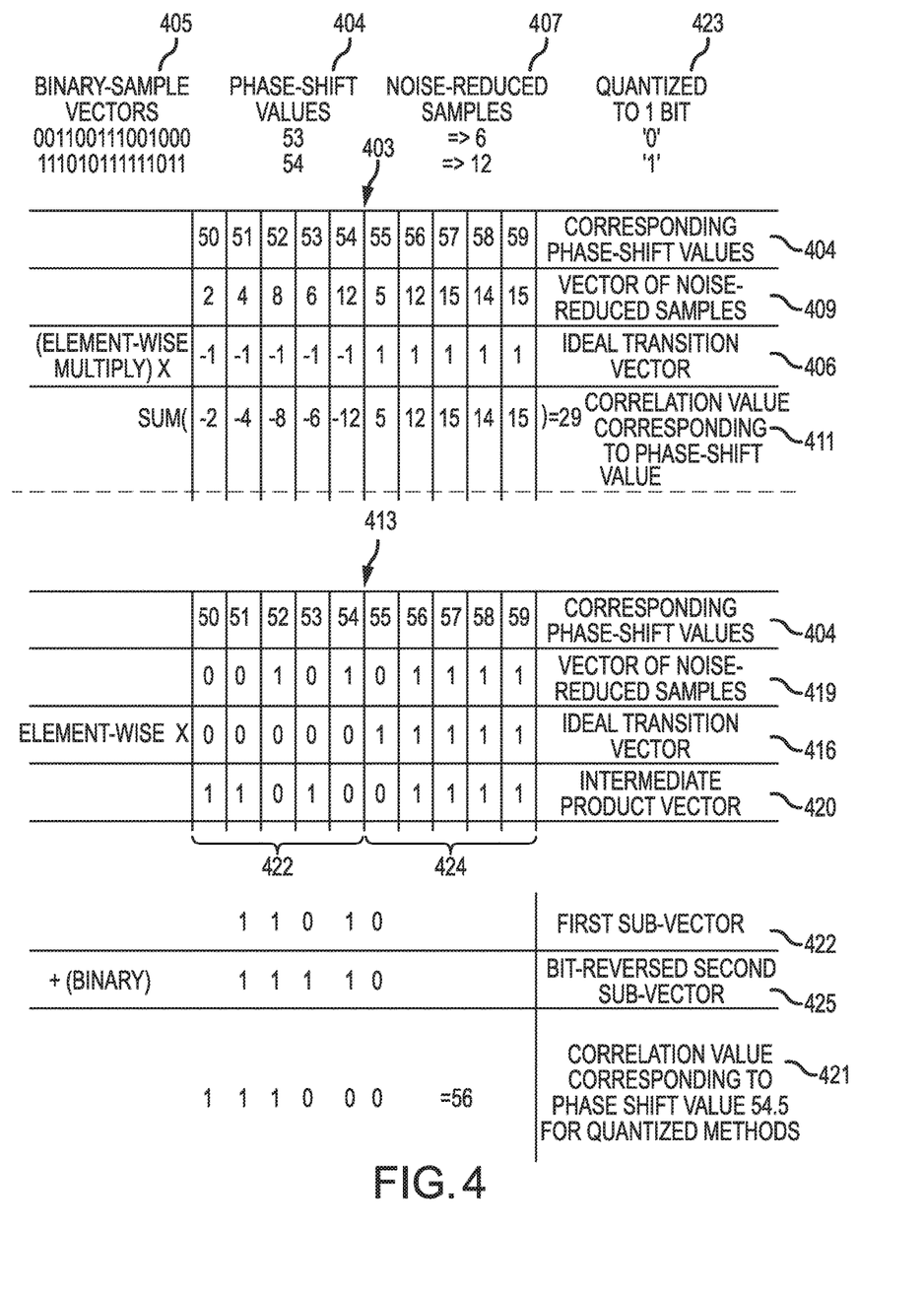
FIG. 4 illustrates the operation a signal-source locating system in accordance with some embodiments.

FIG. 4 illustrates noise reduction operations in accordance with some embodiments. A noise-reduction element (e.g., the noise-reduction element 208 of FIG. 2) may be arranged to use multiple sampled signal outputs (e.g., the sampled signal output 206 of FIG. 2) taken at the same delay value or phase-shift value from a sampler (e.g., the sampler 204 of FIG. 2) to produce a noise-reduced output (e.g., the noise-reduced output 209 of FIG. 2) for use by a correlation element (e.g., the correlation element 210 of FIG. 2).

In some embodiments, the noise-reduction element may receive a plurality of the sampled signal outputs from the sampler. Each sampled signal output may comprise a binary-sample vector 405 of one-bit samples taken at a common phase shift value by the sampler. The noise-reduction element may produce a noise-reduced sample 407 from the elements of each binary-sample vector 405 (e.g., by either averaging or summing the elements of each binary-sample vector 405). Each noise-reduced sample 407 may have a corresponding phase shift value 404. In these embodiments, the noise-reduction element 208 may order the noise-reduced samples 407 based on their corresponding phase shift values 404 to provide a vector of noise reduced samples 409 for use by the correlation element 210.

In these embodiments, the correlation element may be arranged to element-wise multiply, then sum (e.g., correlate) the vector of noise-reduced samples 409 with an ideal-transition vector 406 to generate a correlation value 411 corresponding to a phase shift of the noise-reduced sample nearest a transition 403 of the ideal-transition vector 406. The correlation value 411 may be provided to a controller (e.g., the controller 212 of FIG. 2).

In some embodiments, the ideal-transition vector 406 may represent an ideal transition from either high-to-low or low-to-high. In some embodiments, a single one-bit sample instead of a plurality of sampled signal outputs may be used when noise reduction is not being implemented.

In some embodiments, when the transition occurs in the center of the ideal-transition vector 406 and the number of elements in the vector of noise-reduced samples 409 is odd, the correlation value 411 corresponds to the phase shift of the noise-reduced sample in the center of the vector of noise-reduced samples 409. When the number of elements in the vector of noise-reduced samples 409 is even (as illustrated in FIG. 4), the correlation value 411 corresponds to the average phase shift of the two noise-reduced samples at the center of the vector of noise-reduced samples 409. In the example illustrated in FIG. 4, the average phase shift of the two noise-reduced samples at the center of the vector of noise-reduced samples 409 would be 54.5.

In some noise-reduction embodiments, a one-bit quantization may be performed. In these embodiments, the noise-reduction element may be arranged to quantize each binary-sample vector 405 to one bit 423 based on either an average of sum of the one-bit samples of the binary-sample vector 405 to produce a vector of quantized noise-reduced samples 419 for use by the correlation element. In these embodiments, the resulting quantized value 423 of the noise-reduced sample 407 may be one if the binary-sample vector 405 contains more ones than zeros, otherwise the resulting quantized value 423 of the noise-reduced sample 407 may be zero.

In these embodiments that perform one-bit quantization, the correlation element may be arranged to perform an element-wise multiplication of the vector of quantized noise-reduced samples 419 with an ideal-transition vector 416 to generate an intermediate product vector 420. The intermediate product vector may comprise a first sub-vector 422 and a second sub-vector 424. The correlation element may perform a bit reversal on the second sub-vector 424 to generate a bit-reversed second sub-vector 425, and may add, by binary addition, the first sub-vector 422 to the bit-reversed second sub-vector 425 to produce a correlation value 421. The correlation value 421 may be provided to the controller.

In some embodiments that perform one-bit quantization, the ideal transition vector 406 may also be quantized to one bit (e.g., zero for negative values, one for positive values). The bits of the intermediate product vector 420 resulting from the element-wise multiplication may be ones when corresponding bits in the vector of noise-reduced samples and the ideal-transition vector 416 are the same, and may be zeros when corresponding bits in the vector of noise-reduced samples and the ideal-transition vector 406 are different. In some alternate embodiments, an exclusive-or (XOR) operation may be used to generate the resulting intermediate product vector 420.

In some embodiments, the element-wise multiplication may comprise a weighted multiplication using multiplicative weights based on a vector element position relative to the transition 413 in the ideal-transition vector 416. In some embodiments, the multiplicative weights may be a function of $2^n$, where n is the number of elements between a current element of the quantized noise-reduced samples 419 and the transition 413 of the ideal-transition vector 416. With this set of weights, the correlation element may only need to perform only a single addition operation for each correlation value, although the scope of the embodiments is not limited in this respect. After the element-wise multiplication with the ideal-transition vector 416, the first sub-vector 422 and the second sub-vector 424 of the intermediate product vector 420 (delimited by the index of the transition of the ideal-transition vector) may be treated as unsigned integers and summed after a bit reversal of the second sub-vector 424 (e.g., the right-hand sub-vector).

Figure 5:
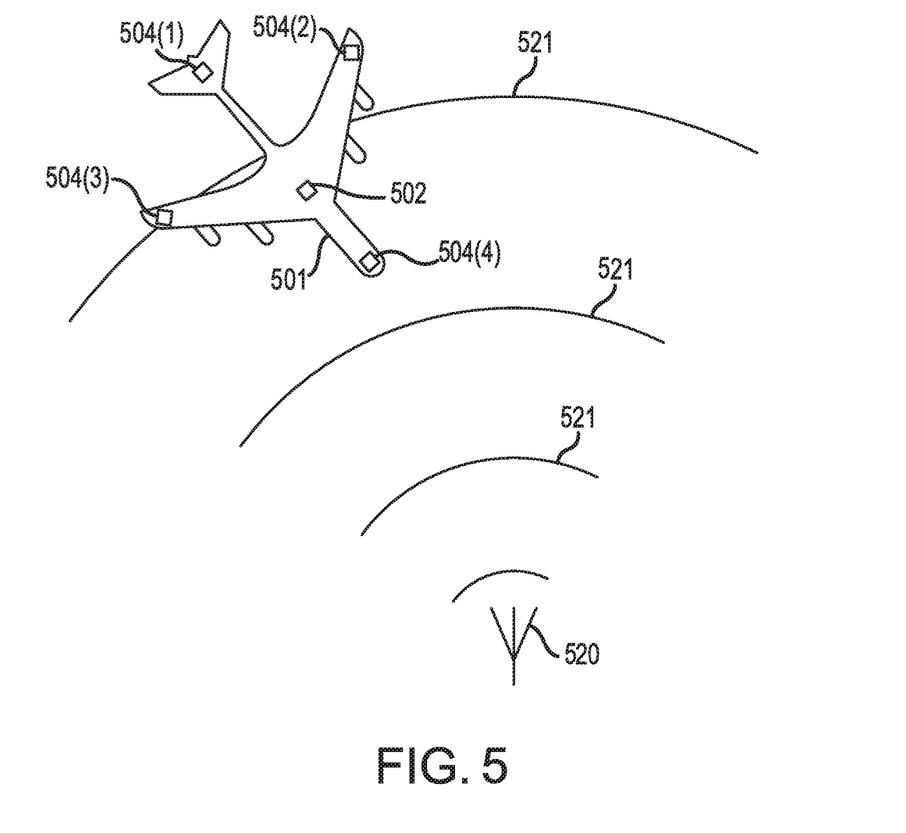
FIG. 5 illustrates exemplary signal timing diagrams for determining a correlation between signal phases and a step function by the correlation element in accordance with some embodiments.

FIG. 5 illustrates the operation of a signal-source locating system in accordance with some embodiments. An aircraft 501 (or other vehicle) may include the signal-source locating system that includes a master device 502 and a plurality of spatially-distributed remote devices 504(1-4), each coupled to the master device 502 by a two-way signal path. It will be appreciated that more or less than four of the remote devices may be included on the aircraft 501. The spatially-distributed remote devices 504(1-4) may be remote sensor devices. The signal-source locating system may be configured to determine a direction to a signal source 520 or locate the signal source 520 based on signals 521 emanating from the signal source 520.

The master device 502 may include a phase difference estimator, such as the phase difference estimator 120 of FIG. 1, the phase difference estimator 220 of FIG. 2, or combinations thereof. The phase difference estimator may be configured to estimate the respective relative phase difference between a reference clock signal of the first device 102 and a respective monitored clock signal of each of the spatially-distributed remote devices 504(1-4).

In some embodiments, each of the spatially-distributed remote devices 504(1-4) may be arranged to detect and record time-of-arrival (TOA) data of the signals and the master device 502 may compare the TOA data from the spatially-distributed remote devices 504(1-4) to estimate a direction or geo-location of a signal source 520. The TOA data may be compensated based on the respective relative phase differences.

In some embodiments, the signal-source locating system may be part of a radar-warning receiver (RWR) system for use on an aircraft 501. In these embodiments, each of the spatially-distributed remote devices 504(1-4) may comprise a RWR system arranged to detect and record TOA data 521, which may be radar pulses, for example. The master device 502 may compare the TOA data from the RWR system to estimate a direction (e.g., angle of incidence) or geo-location of a radar signal source 520.

The TOA data that is provided by the spatially-distributed remote devices 504(1-4) to the master device 502 may differ due to differences in timing of the monitored clocks signals at each of the spatially-distributed remote devices 504(1-4) due to each of the spatially-distributed remote devices 504(1-4) having independently generated clock signals. In these embodiments, the master device 502 may compensate the TOA data based on the phase difference estimation by the phase difference estimator to correctly determine the times at which observations are made to precisely estimate the direction of the source 520.

In some embodiments, clock-phase differences of spatially-distributed subsystems may be determined. In these embodiments, spatially-distributed remote devices 504 and the master device 502 may utilize synchronous clocks for communication of the TOA estimates. The use of the phase difference estimator 220 of FIG. 2 may help reduce temporal unknown in data fusion from the spatially-distributed remote devices 504(1-4), compensate for differences in the independent spatially-distributed remote devices 504(1-4). In some examples, the master device 502 and the remote devices 504(1-4) may have a common clock source located at the master device 502, but the monitored clock signals of each of the spatially-distributed remote devices 504(1-4) may have slightly different timing. In some examples, a counter in each of the spatially-distributed remote devices 504(1-4) may be reset by a pulse sent to each of the spatially-distributed remote devices 504(1-4) by the master device 502. If each of the spatially-distributed remote devices 504(1-4) were to report a concurrent event with a timestamp with the counter value at the time of occurrence, a discrepancy between the reports' timestamps would be observed due to the difference in phases of the monitored clock signals of each of the spatially-distributed remote devices 504(1-4). The phase difference estimate may be used to compensate for this phase difference to determine the actual time of occurrence relative to the master clock or the clock of one remote device relative to another.

Figure 6:
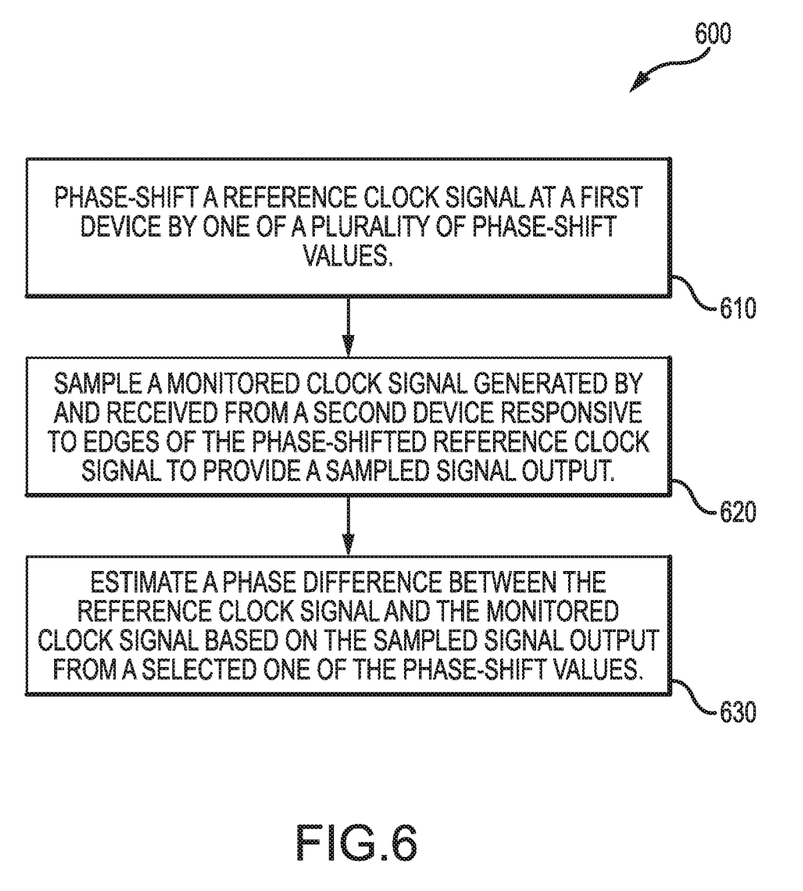
FIG. 6 is a flowchart of a method to estimate a phase difference between a reference clock signal of a master device and a monitored clock signal of a remote device in accordance with some embodiments.

FIG. 6 is a flowchart for a method for estimating a phase difference between a reference clock signal at a master device and a monitored clock signal from a remote device in accordance with some embodiments. The method 600 may be performed by a phase difference estimator, such as the phase difference estimator 120 of FIG. 1, the phase difference estimator 220 of FIG. 2, or combinations thereof. The method 600 may be performed to estimate a phase difference between a reference clock signal at a master device (e.g., the first device 102 of FIG. 1 and/or the master device 502 of FIG. 5) and a monitored clock signal at a remote device (e.g., the second device 104 of FIG. 1 and/or any one of the remote devices 504(1-4) of FIG. 5).

The method 600 may include, phase-shifting, at a first device, the reference clock signal by one of a plurality of phase-shift values, at 610. The phase shift may be performed by a phase shifter, such as a phase shifter included in the delay element 202 of FIG. 2 of the master device. The phase shift may be controlled by a controller, such as the controller 212 of FIG. 2, which may be connected or integral to the master device. In some examples, the method 600 may further include initializing a phase shift of the reference clock signal to compensate for a propagation delay between the master device and the remote device.

The method 600 may further include sampling the monitored clock signal generated by and received from a remote device responsive to edges of the phase-shifted reference clock signal to generate a sampled signal output, the monitored clock signal generated at the remote device, at 620. The sampling may be performed by a sampler, such as the sampler 204 of FIG. 2, which may also be connected to or integral to the master device.

The method 600 may further include generating a phase difference estimate based on the sampled signal output from a selected one of the phase-shift values for use in determining a phase difference between the reference clock signal and the monitored clock signal, at 630. This may be performed by the controller 212 of FIG. 2, for example.

In some examples, the method 600 may further include sampling a plurality of sampled signal outputs at a common one of the phase shift values, and providing a noise-reduced output based on the plurality of sampled signal outputs. The sampling may be performed by the sampler 204 of FIG. 2, in some examples. The noise reduced output may be provided by the noise-reduction element 208 of FIG. 2, in some examples. In some examples, the method 600 may further include correlating the noise-reduced output with a step function to generate a correlation value for each of the phase-shift values, such as via the correlation element 210 of FIG. 2. The phase difference estimate may be based on the correlation value. In some examples, the method 600 may further include stepping through a subset of the phase-shift values of the plurality to select one of the phase-shift values based on the correlation values to generate the phase difference estimate. The stepping may be performed by the controller 212 of FIG. 2, in some examples.

In some embodiments, the method 600 may include a noise reduction operation, performed by the noise-reduction element 208 of FIG. 2, in some examples. For example, the method 600 may further include receiving a plurality of sampled signal outputs. Each of the plurality of sampled signal outputs may include a respective binary-sample vectors of one-bit samples taken at a common phase shift value. The method 600 may include quantizing each of the respective binary-sample vector to one bit to produce a vector of quantized noise-reduced samples as the noise reduced output. In another example, the method 600 may further include receiving a plurality of sampled signal outputs, each of the plurality of sampled signal outputs comprising a respective binary-sample vector of one-bit samples taken at a common phase shift value by the sampler, and providing a noise-reduced sample from the elements of each respective binary-sample vector, each noise-reduced sample having a corresponding phase shift value. The method 600 may further include ordering the noise-reduced samples based on their corresponding phase shift values to provide a vector of noise reduced samples for use by the correlation element.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A phase difference estimator to estimate a phase difference between related clock signals of a first device and a second device, the phase difference estimator comprising:
    a delay element to delay a reference clock signal by one of a plurality of delay values, the reference clock signal comprising a waveform of alternating symbols;
    a sampler to sample a monitored clock signal responsive to edges of the delayed reference clock signal to generate sampled signal outputs, the monitored clock signal generated and provided by the second device;
    a noise-reduction element to sample the sampled signal outputs and to provide noise-reduced sampled signal outputs based on the sampled signal outputs;
    a correlation element to correlate the noise-reduced sampled signal outputs with a step function to generate a correlation value for each of the delay values; and
    a controller to instruct the delay element to delay the reference clock signal by a selected one of the delay values and provide a phase difference estimate output based on the correlation value, the phase difference estimate output indicative of a phase difference between the reference clock signal and the monitored clock signal,
    wherein if the reference clock signal has a period that is an integer multiple of the monitored clock frequency, or if the monitored clock signal has a period that is an integer multiple of the reference clock frequency, the noise-reduction element is configured to generate the noise-reduced sampled signal outputs using integer multiple samples and discard intermediary samples.

2. The phase difference estimator of claim 1, wherein the controller is further configured to initialize the delay element with an initial delay that compensates for a propagation delay between the second device and the first device.

3. The phase difference estimator of claim 1, wherein the sampler, responsive to an edge of the reference clock signal, provides a first output value based on the monitored clock signal being low, and wherein the sampler, responsive to the edge of the reference clock signal, provides a second output value based on the monitored clock signal being high.

4. The phase difference estimator of claim 1, wherein the period of the reference clock signal is an integer multiple of the monitored clock signal.

5. The phase difference estimator of claim 1, wherein the period of the monitored clock signal is an integer multiple of the reference clock signal.

6. The phase difference estimator of claim 1, wherein the delay element comprises a phase-shifter to phase shift the reference clock signal by one of a plurality of phase-shift values, wherein the controller is configurable to cause the phase-shifter to shift through at least a subset of the plurality of phase-shift values and select one of the phase-shift values that provides a correlation value above a threshold.

7. The phase difference estimator of claim 6, wherein each of the phase-shift values are a fraction of a period of the reference clock signal.

8. The phase difference estimator of claim 6, wherein the noise-reduction element is configured to sample the sampled signal outputs at a common one of the phase shift values and to provide a noise-reduced sampled signal output based on the sampled signal outputs, wherein the correlation element correlates the noise-reduced sampled signal output with a step function to generate the correlation value for each of the phase shift values.

9. The phase difference estimator of claim 8, wherein the noise-reduction element is further configured to:
    receive the sampled signal outputs from the sampler, each of the sampled signal outputs comprising a respective binary-sample vector of one-bit samples taken at a common phase shift value by the sampler;
    provide a noise-reduced sample from the elements of each respective binary-sample vector, each noise-reduced sample having a corresponding phase shift value; and
    order the noise-reduced samples based on their corresponding phase shift values to provide a vector of noise reduced samples for use by the correlation element.

10. The phase difference estimator of claim 8, wherein the noise-reduction element is further configured to:
    receive the sampled signal outputs from the sampler, each of the sampled signal outputs comprising a respective binary-sample vector of one-bit samples taken at a common phase shift value by the sampler; and
    quantize each of the respective binary-sample vector to one bit to produce a vector of quantized noise-reduced samples.

11. The phase difference estimator of claim 10, wherein the correlation element is further configured to element-wise multiply and sum the vector of noise-reduced samples with an ideal-transition vector to generate a correlation value corresponding to a phase shift of the noise-reduced sample nearest a transition of the ideal-transition vector.

12. The phase difference estimator of claim 11 wherein the element-wise multiplication includes a weighted multiplication using multiplicative weights based on a vector element position relative to the transition in the ideal-transition vector.

13. The phase difference estimator of claim 1, wherein the first device and second device are each configurable to operate a first mode or a second mode, wherein while in the first mode, the second device provides the monitored clock signal to the first device, and wherein while in the second mode, the second device receives data from and provides data to the first device.

14. A signal-source locating system comprising:
a remote device that includes a monitored clock signal; and
a master device coupled to the remote device by a two-way signal path, the master device including a phase difference estimator to estimate a phase difference between a reference clock signal generated by the master device and the monitored clock signal received from the remote device, wherein the phase difference estimator to:
delay the reference clock signal by one of a plurality of delay values;
sample the monitored clock signal responsive to a edge of the reference clock signal to generate sampled signal outputs;
sample the sampled signal outputs with a noise-reduction element to provide noise-reduced sampled signal outputs based on the sampled signal outputs;
correlate the noise-reduced sampled signal output with a step function to generate a correlation value for each of the delay values; and
responsive to the correlation value exceeding a threshold, generating a phase difference estimate between the reference clock signal and the monitored clock signal based on the sampled signal output from a selected one of the delay values,
wherein if the reference clock signal has a period that is an integer multiple of the monitored clock frequency, or if the monitored clock signal has a period that is an integer multiple of the reference clock frequency, the noise-reduction element is configured to generate the noise-reduced sampled signal outputs using integer multiple samples and discard intermediary samples.

15. The signal-source locating system of claim 14, wherein the phase difference estimator further to initialize the delay element with a delay that compensates for a propagation delay between the remote device and the master device.

16. The signal-source locating system of claim 14, wherein the period of the reference clock signal is an integer multiple of the monitored clock signal.

17. The signal-source locating system of claim 14, wherein the period of the monitored clock signal is an integer multiple of the reference clock signal.

18. The signal-source locating system of claim 14, wherein the master device further includes a correlation element to correlate the noise-reduced sample signal outputs with a step function to generate the correlation value for each of the phase shift values.

19. The signal-source locating system of claim 14, wherein the signal-source locating system is part of a radar-warning receiver (RWR) system for use on an aircraft, wherein the signal-source locating system further includes an additional plurality of remote devices configured to detect and record time-of-arrival (ToA) data of radar pulses, wherein the master device further to compare the ToA data from the plurality of remote devices to estimate a direction or geo-location of a signal source transmitting the radar pulses.

20. A method for estimating a phase difference between a reference clock signal at a master device and a monitored clock signal from a remote device, the method comprising:
delaying a reference clock signal by one of a plurality of delay values, the reference clock signal comprising a waveform of alternating symbols;
sampling a monitored clock signal responsive to edges of the delayed reference clock signal to generate sampled signal outputs, the monitored clock signal generated and provided by the remote device;
noise-reducing the sampled signal outputs to provide noise-reduced sampled signal outputs based on the sampled signal outputs;
correlating the noise-reduced sampled signal outputs with a step function to generate a correlation value for each of the delay values; and
delaying the reference clock signal by a selected one of the delay values to provide a phase difference estimate output based on the correlation value, the phase difference estimate output indicative of a phase difference between the reference clock signal and the monitored clock signal,
wherein if the reference clock signal has a period that is an integer multiple of the monitored clock frequency, or if the monitored clock signal has a period that is an integer multiple of the reference clock frequency, the method further comprises generating the noise-reduced sampled signal outputs using integer multiple samples and discarding intermediary samples.

21. The method of claim 20, further comprising
sampling the sampled signal outputs at a common one of the plurality of phase shift values;
providing a noise-reduced sampled signal output based on the plurality of sampled signal outputs; and
correlating the noise-reduced sampled signal output with a step function to generate a correlation value for each of the phase-shift values, wherein generating a phase difference estimate is based on the correlation value.

22. The method of claim 21 further comprising stepping through a subset of the plurality of phase-shift values to select one of the plurality of phase-shift values based on the correlation values to generate the phase difference estimate.

23. The method of claim 21 further comprising
receiving the sampled signal outputs, each of the sampled signal outputs comprising a respective binary-sample vector of one-bit samples taken at a common phase shift value; and
quantizing each of the respective binary-sample vector to one bit to produce a vector of quantized noise-reduced samples as the noise reduced output.

24. The method of claim 21 further comprising
receiving the sampled signal outputs, each of the sampled signal outputs comprising a respective binary-sample vector of one-bit samples taken at a common phase shift value by the sampler
providing a noise-reduced sample from the elements of each respective binary-sample vector, each noise-reduced sample having a corresponding phase shift value; and
ordering the noise-reduced samples based on their corresponding phase shift values to provide a vector of noise reduced samples for use by the correlation element.

25. The method of claim 20, further comprising initializing a phase shift of the reference clock signal to compensate for a propagation delay between the master device and the remote device.

* * * * *

UNITED STATES PATENT AND TRADEMARK OFFICE
CERTIFICATE OF CORRECTION

PATENT NO. : 10,495,727 B2
APPLICATION NO. : 15/426193
DATED : December 3, 2019
INVENTOR(S) : Gunn et al.

Page 1 of 1

It is certified that error appears in the above-identified patent and that said Letters Patent is hereby corrected as shown below:

In the Specification

In Column 2, Line 6, delete "structural logical" and insert --structural, logical,-- therefor In Column 2, Line 26, after "signal", insert --,--

In Column 3, Line 23, after "optical", insert --,--

In the Claims

In Column 14, Line 29, in Claim 21, after "comprising", insert --:--

In Column 14, Line 42, in Claim 23, after "comprising", insert --:--

In Column 14, Line 50, in Claim 24, after "comprising", insert --:--

In Column 14, Line 54, in Claim 24, after "sampler", insert --;--

Signed and Sealed this
Seventh Day of July, 2020

Andrei Iancu
*Director of the United States Patent and Trademark Office*